(12) United States Patent
Stiel

(10) Patent No.: US 7,997,200 B2
(45) Date of Patent: Aug. 16, 2011

(54) PRINTING MACHINE AND A METHOD FOR PRODUCING A PRINTED PRODUCT

(75) Inventor: Jürgen Alfred Stiel, Thüngen (DE)

(73) Assignee: Koenig & Bauer Aktiengesellschaft, Wurzburg (DE)

( * ) Notice: Subject to any disclaimer, the term of this patent is extended or adjusted under 35 U.S.C. 154(b) by 462 days.

(21) Appl. No.: 11/921,186

(22) PCT Filed: Apr. 27, 2006

(86) PCT No.: PCT/EP2006/061872
§ 371 (c)(1),
(2), (4) Date: Mar. 11, 2009

(87) PCT Pub. No.: WO2006/131422
PCT Pub. Date: Dec. 14, 2006

(65) Prior Publication Data
US 2009/0188405 A1 Jul. 30, 2009

(30) Foreign Application Priority Data
Jun. 7, 2005 (DE) .......................... 10 2005 026 127

(51) Int. Cl.
*B41F 17/00* (2006.01)
*B41F 33/00* (2006.01)

(52) U.S. Cl. ...................................... 101/484; 101/480

(58) Field of Classification Search .................. 101/480, 101/484; *B41F 17/00, 33/00*
See application file for complete search history.

(56) References Cited

U.S. PATENT DOCUMENTS

| 5,471,309 | A | 11/1995 | Bolza-Schunemann |
| 5,823,692 | A * | 10/1998 | Tolrud et al. ................... 400/582 |
| 6,313,747 | B2 | 11/2001 | Imaichi et al. |
| 6,645,327 | B2 * | 11/2003 | Austin et al. ..................... 156/64 |
| 6,695,501 | B2 * | 2/2004 | Nedblake et al. ............. 400/621 |
| 2002/0035939 | A1* | 3/2002 | Endo et al. .................... 101/480 |
| 2003/0061947 | A1 | 4/2003 | Hohberger et al. |
| 2004/0134620 | A1 | 7/2004 | Soeborg |
| 2004/0154161 | A1* | 8/2004 | Aoyama et al. ................. 29/739 |
| 2005/0160935 | A1* | 7/2005 | Armstrong et al. ........... 101/485 |
| 2006/0213384 | A1 | 9/2006 | Reinhard et al. |
| 2006/0230966 | A1 | 10/2006 | Brod et al. |
| 2007/0039694 | A1 | 2/2007 | Walther et al. |

FOREIGN PATENT DOCUMENTS

| DE | 42 17 942 A1 | 12/1993 |
| DE | 103 03 282 A1 | 8/2003 |
| DE | 103 32 212 A1 | 2/2005 |
| DE | 600 09 643 T2 | 4/2005 |
| DE | 10 2005 011 697 A1 | 11/2005 |
| EP | 1 167 036 A1 | 1/2002 |
| EP | 1 107 205 B1 | 4/2004 |

(Continued)

*Primary Examiner* — Daniel J Colilla
*Assistant Examiner* — Jennifer Simmons
(74) *Attorney, Agent, or Firm* — Jones, Tullar & Cooper, P.C.

(57) ABSTRACT

A printing machine is provided with at least one printing unit that is usable for printing an image, in ink, on a printable material. The printing machine includes at least one application device which is usable to apply at least one contactless identification characteristic, in the form of an RFID system or a part thereof, to the printable material. At least one inspection device is also provided in the printing machine. At least one test device, for testing the identification characteristic, or the part thereof, is also provided in the printing machine.

45 Claims, 9 Drawing Sheets

FOREIGN PATENT DOCUMENTS

| | | |
|---|---|---|
| WO | WO 96/40443 | 12/1996 |
| WO | WO 02/35463 A2 | 5/2002 |
| WO | WO 2005/013179 A2 | 2/2005 |
| WO | WO 2005/013179 A3 | 2/2005 |
| WO | WO 2005/013189 A2 | 2/2005 |
| WO | WO 2005/021276 A1 | 3/2005 |
| WO | WO 2005/028203 A1 | 3/2005 |
| WO | WO 2005021276 A1 * | 3/2005 |

* cited by examiner

PRINTING MACHINE AND A METHOD FOR PRODUCING A PRINTED PRODUCT

CROSS-REFERENCE TO RELATED APPLICATIONS

This application is the U.S. national phase, under 35 USC 371, of PCT/EP2006/061872, filed Apr. 27, 2006; published as WO 2006/131422 A1 on Dec. 14, 2006 and claiming priority to DE 10 2005 026 127.2, filed Jun. 7, 2005, the disclosures of which are expressly incorporated herein by reference.

FIELD OF THE INVENTION

The present invention is directed to a printing machine and to a method for producing a printed product. The printing machine has at least one printing group which is usable for printing on a printing substrate with printing ink. At least one RFID system, or a portion thereof, can be applied to the printing substrate by the printing machine.

BACKGROUND OF THE INVENTION

The present invention is directed to the specific technology in which a contactless identification feature, such as an RFID system, wherein RFID=Radio Frequency Identification or a portion of such a system, which is used in the electronic labeling of objects, such as product packaging, is applied to a printing substrate, such as in the form of a label, or is applied directly to a package, in the form of electronic labeling using so-called Smart Labels. The central element of an RFID system is a transponder, which exchanges data with a transmitting/receiving station by the use of radio waves, for example by the use of such radio waves within the long-wave range. The essential components of a transponder are an integrated circuit for use in controlling the transponder functions, and an antenna oscillator circuit for use in receiving and transmitting radio waves. Passive transponders do not have their own energy supply. Instead, they draw their energy from the transmitting signal of the transmitting/receiving station.

An RFID system therefore uses the transponder technology to enable a contactless, wireless identification of products such as packages. In place of, or in addition to identification data, other, more complex data such as sales prices, manufacturing data, expiration dates, manufacturing locations, encryption data, and the like can also be transmitted by the RFID system.

A method of manufacturing RFID labels, using a printing process, is known from WO 2005/013189 A2. The antenna and an oscillator circuit of the transponder are applied to the printing substrate via sheet-fed offset printing or using a high-pressure printing plate.

A method for printing a substrate is known from WO 2005/021276 A1. The substrate is guided through two printing groups of a printing machine that are connected inline. The printing substrate is printed with ink in one printing group. In another printing group, the printing substrate is printed with electrical printed conductors in the form of an antenna of an RFID system. A chip can also be glued to the printing substrate to be in electrical contact with the antenna.

A printing machine for printing electrical circuits directly onto a substrate using an electrically conductive liquid is known from WO 96/40443 A1. Additional stations, for inspecting the quality of the printed circuits, can be provided within the machine.

An RFID label with an RFID antenna and an RFID chip is known from WO 2005/028203 A1.

DE 103 32 212 A1 describes a device for the quality control of sheets using a plurality of inspection devices.

DE 103 03 282 A1 describes an inline quality control system for printed, stamped and/or structured material webs that makes it possible to detect various properties of the material web.

DE 600 09 643 T2 describes the use of various printing processes to produce a resonance label.

US 2003/0061947 A1 describes a device for printing and applying RFID labels. An inspection of the RFID label is performed prior to its application.

SUMMARY OF THE INVENTION

The object of the present invention is to devise a printing machine and a method for producing a printed product.

The object is attained according to the invention with the provision of a printing machine having at least one printing group which is usable to print on a printing substrate, using printing ink. At least one application device, which is usable to apply at least one contactless identification feature, which is configured as an RFID system, or a portion thereof, to the printing substrate, is included in the printing machine. At least one inspection device for use in inspecting the identification feature, or the portion thereof, is included in the printing machine.

The advantages to be achieved with the present invention consist especially in that, the inspection devices are preferably integrated inline in the printing machine. These inspection devices, in addition to inspecting the identification features, can also be configured to inspect the printed image. The result is that identification features of overall high quality or with low error rates, especially such as printed products that bear RFID systems, can be generated in a relatively simple manner.

BRIEF DESCRIPTION OF THE DRAWINGS

Preferred embodiments of the present invention are represented in the set of drawings and will be described in greater detail in what follows.

The drawings show.

DESCRIPTION OF THE PREFERRED EMBODIMENTS

Figure 1:
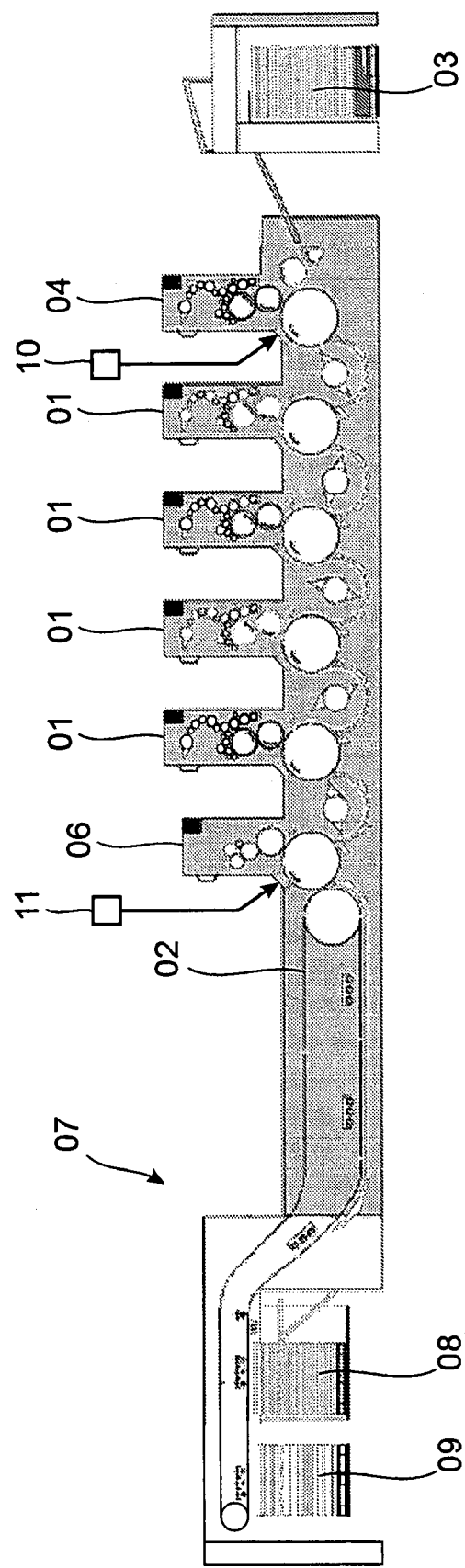
FIG. 1 a schematic representation of a first preferred embodiment of a printing machine in accordance with the present invention in a side view.

Referring initially to FIG. 1, in the preferred embodiment of the present invention which is illustrated in this figure, there is depicted a printing machine. The specific printing machine depicted in FIG. 1 is a rotary offset printing machine. However, it is understood that a printing machine in accordance with the present invention could also operate using a different printing process. Further, for purposes of simplification of the illustration, FIG. 1 shows a sheet-fed offset printing machine which is intended for use solely for straight printing.

The rotary offset printing machine in accordance with the preferred embodiment shown in FIG. 1 operates using a four-color printing process. It will be clearly understood that other embodiments, in which the printing machine is configured to print more or fewer colors, are also possible.

The sheet-fed offset printing machine, depicted schematically in FIG. 1, is configured for single-sided printing of printing substrates 02, such as, for example sheets 02, which sheets 02 are removed from a supply stack 03 and which are then passed through or otherwise run through four printing groups 01 in series. These four printing groups 01 print, for example for the colors cyan, magenta, yellow and black on the printing substrates or sheets 02. Upstream from the printing groups 01, when viewed in the direction of transport of the sheets 02, an application device 4 is arranged inline with the printing groups 01 and is usable to apply a contactless identification feature, such as an RFID system or a portion of an RFID system, such as, for example, an antenna of a transponder, to the sheets 02. The RFID system preferably has a resonance frequency of 8.2 MHz or 13.56 MHz. In the case of the depicted preferred embodiment of FIG. 1, the application device 04, which may be, for example, a separate printing device 04, is another printing group 04 that operates using the offset process. An electrically conductive material, especially a printing ink, which can be either colored or transparent, is printed in the form of electrical printed conductors, which can form an antenna of a transponder. In an alternative embodiment, the printing group 04 can operate using another printing process, and especially using an intaglio printing process or a letterpress printing process.

Thus, in the case of the above-described first preferred embodiment of the printing machine in accordance with the present invention, first the identification features, or portions thereof are applied to the sheets 02. The sheets 02 are then printed on in a multicolor printing process. The identification features may be colorless, and the multicolor printing process may or may not print over the identification features. Between the application device 04 and the subsequent printing group 01, an intermediate drying step, which is not specifically shown may be provided as needed. In principle, the application device 04 could also be arranged downstream from the printing groups 01, as viewed in the direction of transport of the sheets 02.

According to a further preferred embodiment of the present invention, which is not specifically shown here, the application device 04 can also consist, for example, of three printing groups connected in series. In a first such printing group, an electrically semiconductive, preferably organic material, such as, for example, electrically semiconductive polytropes or polymers or electrically conductive materials, such as copper, aluminum or silver, for example, is imprinted. In a second printing group, an electrically insulating material, preferably a polyolefin such as polyethylene, polypropylene, ionomer, polystyrene, polyester, an ethylene-methacrylic acid copolymer or polymers, is imprinted. In a third printing group an electrically conductive material is imprinted. In this manner, active components, such as, for example, in the form of transistors, can be printed onto the substrate, and can be interconnected as semiconductor chips.

Preferably, in one printing group 04, an electrically semiconductive polymer is applied and in another, for example, subsequent, printing group 04 an electrically insulating polymer is applied. An electrically conductive polymer, preferably for the electrode structure, can also optionally be printed in an additional printing group 04 or in a plurality of additional printing groups 04.

These polymers are preferably soluble in solvents which are intended for printing and can therefore be used, for example, as printable inks.

Viewed in the direction of transport of the sheets 02 in FIG. 1, a finishing station 06 is arranged downstream from, and is inline with the printing groups 01. Such a finishing station 06 be, or can comprise, for example, a coating unit 06. Following their passage through the finishing station 06, the printed sheets 02 that are equipped with the contactless identification feature, or with a plurality of such identification features, are placed by a delivery extension 07 on one of two optionally selectable holding stacks 08; 09 connected in series. The holding stack 08 may be intended, for example, to hold defective sheets and the holding stack 09 may be intended, for example, to hold properly printed products, so that defective ones of the printed sheets 02 can be removed by sorting.

The printed products can be configured especially as folded cardboard boxes or as labels. The sheets 02 themselves, or the cylinders of the printing groups 01 or of the application device 04, and the finishing station 06 are preferably dimensioned such that, both in the axial direction of the cylinders, or in the direction of the width of the sheets 02, and in the circumferential direction of the cylinders, or in the longitudinal direction of the sheets 02, a plurality of copies of the printed product are provided. Accordingly, a plurality of identification features are applied to each sheet 02.

The printing machine depicted in FIG. 1 comprises inspection devices 10; 11 that preferably operate in a contactless fashion, and which are usable for inspecting the quality of the printed products and/or for determining the functioning of the identification features applied thereon. The inspection of the function of the identification features applied to each sheet 02 may also encompass a necessary preceding configuration, as will be described in greater detail in what follows. The inspection devices 10; 11 may be configured particularly to inspect the optical properties, such as the color and raster correlation, of the printed image or to inspect the form of the applied identification features and/or the electrical or electromagnetic properties of the identification features, such as, for example, the conductivity of the applied printed conductors and/or the frequency of the applied oscillator circuit, for example in an inductive manner.

In the case of the preferred embodiment of the present invention, which is shown in FIG. 1, the first inspection device 10, which is arranged downstream from the application device 04, can be an optical inspection device 10, and which inspects the applied identification features with respect to their optical characteristics. The inspection device 10 can also be an electrical inspection device or an electromagnetic inspection device 10, which inspects the applied identification features with respect to their electrical and/or their magnetic and/or their electromagnetic properties. Further, the first inspection device 10 can be configured to inspect both the optical and the electrical or magnetic or electromagnetic properties of the identification features. Alternatively, two inspection devices 10 can be provided in series, one for optical inspection and one for electrical or magnetic or electromagnetic inspection.

In principle, the inspection device 10 could also be arranged at another location within the printing machine, such as, for example, downstream from the last printing group 01, as viewed in the direction of travel of the sheet 02, or downstream from the finishing station 06. If an intermediate drying step is performed downstream from the application device 04, the inspection device 10 can also be arranged downstream from the intermediate drying step.

A second inspection device 11 is arranged downstream from the finishing station 06, and could also be arranged downstream from the last printing group 01. This second inspection device 11 preferably conducts an optical inspection of the printed image which has been applied to the sheets 02 via the printing groups 01. This optical inspection can especially comprise an inspection of print coloring, and/or of color density and/or of print register. The second inspection device 11 can further include an optical inspection of the identification features, especially if such an optical inspection is not performed in the first inspection device 10. The second inspection device 11 can optionally also conduct an electrical inspection or a magnetic inspection or an electromagnetic inspection of the identification features, especially if such an inspection was not performed in the first inspection device 10, or if the first inspection device 10 is not provided at this location. Accordingly, two or more inspection devices 11 can optionally also be connected in series.

It is also possible to inspect various properties of the identification features at different locations in different inspection devices 10; 11. For example, the resonance frequencies of the oscillator circuits can be inspected in the first inspection device 10 and the electrical properties of the printed conductors can be inspected in the second inspection device 11.

The second inspection device 11 can optionally also be arranged downstream from the last printing group 01, as viewed in the direction of conveyance of the sheets 02, or can be located between that last printing group 01 and the finishing station 06. The second inspection device 11 can comprise, for example, a CCD surface camera, or a camera with a CMOS chip, or a CCD line camera, as will be described in greater detail further below, which second inspection device, as viewed in the direction of transport, is arranged positioned on the last printing group 01, and especially directed on its impression cylinder 39, as may be seen in FIG. 3, or on the coating unit 06.

Figure 2:
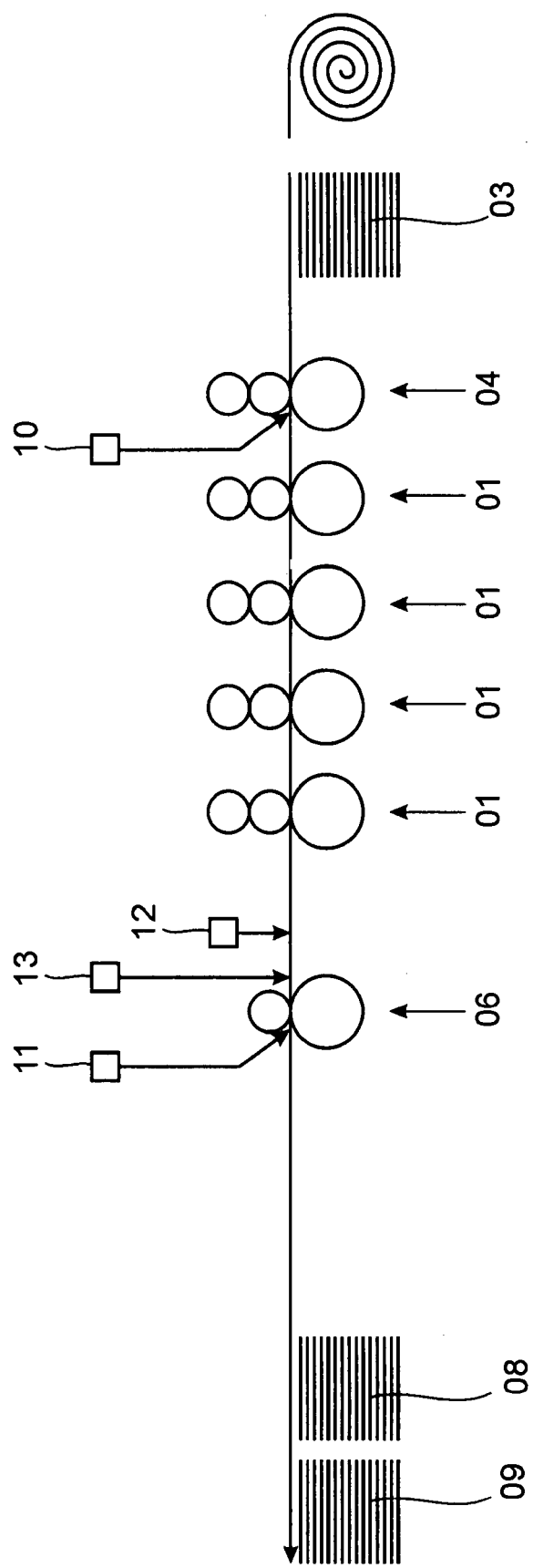
FIG. 2 a schematic representation of a second preferred embodiment of a printing Machine in accordance with the present invention, also in a side view.

The following discussion refers to the second preferred embodiment of the present invention, as depicted in FIG. 2, the configuration of which corresponds in large part to that of FIG. 1, and to which extent, reference is made to the previous description set forth in connection with FIG. 1. In the case of this second preferred embodiment, an application device 12, such as, for example, an adhesive device 12, is also provided inline, via the use of which application device 12, parts of identification features, and especially chips for RFID systems, are applied, especially via the use of adhesive, to the printed sheets 02. As shown in FIG. 2, the adhesive application device 12 is arranged between the last printing group 01 and the finishing station 06. However, it could also be arranged connected directly to the last printing group 01, for example cooperating with its impression cylinder or connected directly to the finishing station 06, for example cooperating with a cylinder of that station, or downstream from the finishing station 06.

To inspect the electrical/electronic functions of these chips, a further, third inspection device 13 can be provided connected to the adhesive device 12, which third inspection device 13 can also involve a physical contacting of the chips by sensor tips. This third inspection device 13 can also be configured such that it likewise comes into contact with the parts of the identification features which were previously applied in the application device 04, for the purpose of inspecting them, for example in order to test the conductivity of the applied printed conductors. Such a contacting inspection device 13 can alternatively or additionally be arranged downstream from the application device 04, including in the case of the preferred embodiment of FIG. 1.

One option for inspecting the electrical or the electronic or the electromagnetic properties of an RFID system, which has been applied to the sheet 02, and using the inspection devices 10 or 11 or 13 will be detailed by way of example. It is assumed that in each case a complete transponder has been applied. In other words, an antenna oscillator circuit for transmitting or receiving radio waves and an IC for controlling those radio waves has been applied. If, for example, only the respective antenna oscillator circuit is applied, it is understood that the corresponding IC inspection is omitted. It may also be sufficient to inspect only one of the plurality of possible functions that can be tested.

The inspection is performed during the production process, and each transponder is inspected individually. In principle, the inspection of each transponder takes place in two sequential steps, namely a first step, in which a configuration of a transponder is performed, and a second step, in which the functions of the configured transponder are tested.

To inspect the configuration of the transponder, the IC of the transponder can be electrically contacted using contacting instruments with sensor tips, which are intended for this purpose and which are connected indirectly to a configuration/data processing system. First, the IC of the transponder is compared with a reference voltage to determine whether a sound electrical contact is present. If such a contact is not present, the corresponding sheet 02 is assigned to the waste paper stack. The frequency of the antenna oscillator circuit that is connected to the IC is then determined via a pulse-width measurement, in which the number of oscillations of a reference signal, during the measurement period, is determined, and from this, the frequency of the measurement signal is calculated. In addition, the identification data, such as especially the identification number, and optionally a key for a digital signal, are programmed in, the key being known only to the authenticated transponder and the reader or the transmitting/receiving station.

In the subsequent functional test, an inspection of the previously established operating parameters is performed, and the functions of the transponder are tested in a contactless fashion. To accomplish this, the transponders are arranged between a transmitter coil, which generates a continuous sinus signal, and a receiver coil. First, the energy storage mechanism of the transponder is charged via the transmitter coil by the use of an unmodulated sinus signal. The necessary instructions and data are then sent, via a modulated sinus signal, to the transponder.

The transmitting signal is then switched off, and the transponder transmits a frequency-modulated response signal. This response signal can be evaluated to test the proper functioning of the transponder and to calculate its parameters, such as its transmitting frequency or its transmitting field strength.

The quality of the transponder/antenna oscillator circuit can be determined by exciting the antenna oscillator circuit to auto-oscillation. Corresponding conclusions can then be drawn from the exponential decay of the signal received on the receiver coil.

One option for using the first and/or second inspection devices 10 and/or 11, respectively, to inspect the optical properties of the printed image generated by the printing groups 01 and/or an RFID system applied to the sheets 02 will now be described in detail by way of an example. The optical testing or inspection device described in the following discussion relates especially to printed products which are produced in a rotary printing machine via an offset printing process. However, it can logically also be used at least with other printing machines, such as, for example, in a printing machine that prints using the die stamping process, the screen printing process or the hot stamp printing process.

In the discussion which follows, when an "image" or the like is mentioned, this also refers to the visual appearance of an identification feature that is accessible for optical inspection.

Figure 3:
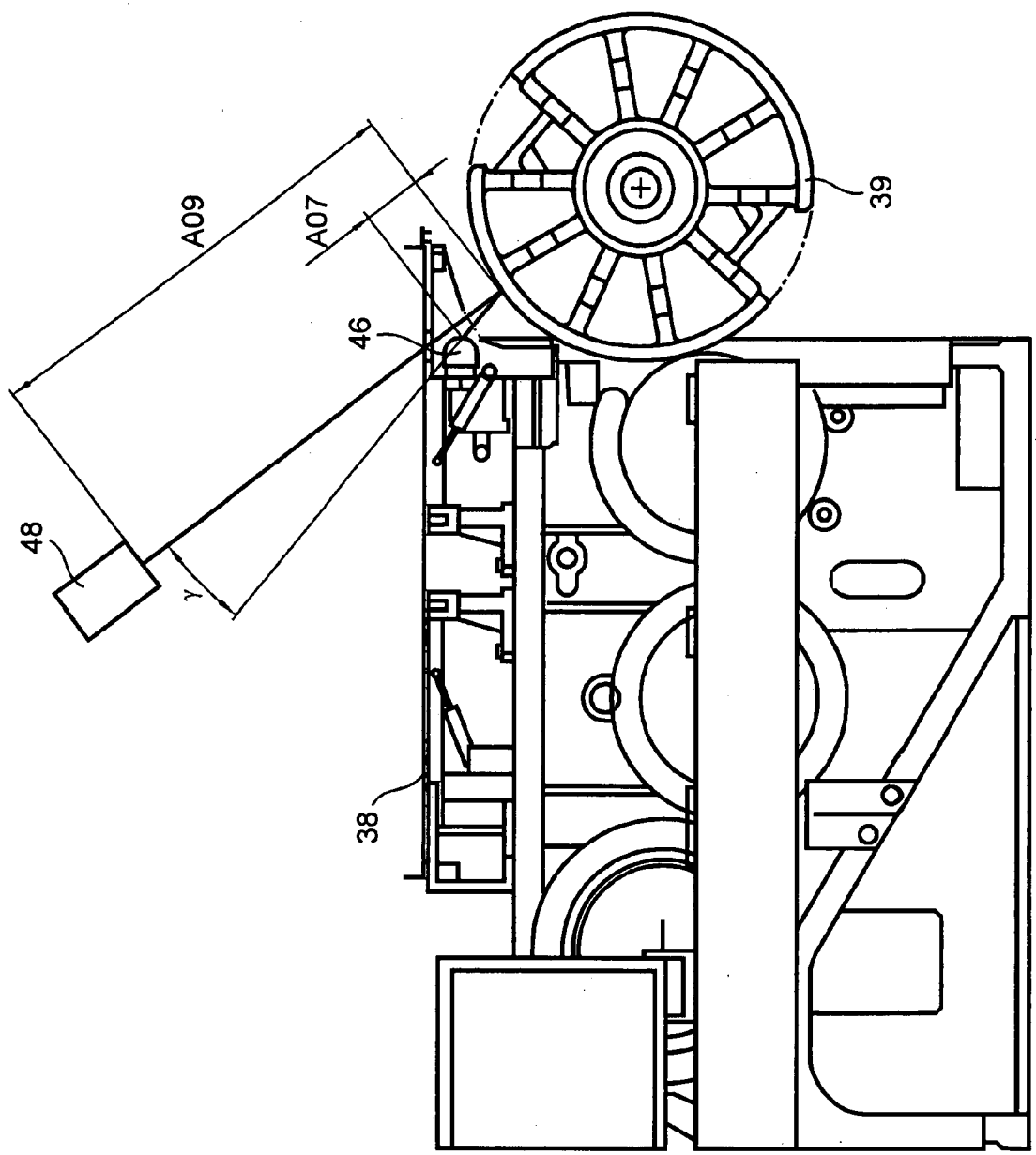
FIG. 3 an arrangement of an inline inspection system in a printing machine according to FIG. 1 or 2.

Referring now to FIG. 3, one inline inspection system including at least one of inspection device 10 or 11, that can be used to assess the quality of a printed product, has at least one imaging unit 48, particularly a camera 48, and preferably a color-line camera system. The color-line camera system preferably uses a color-line camera 48 having, for example, 2,048 pixels per scanning line. The inline inspection system, for use in assessing the quality of the printed matter which is produced by the printing machine, is configured for inline inspection and for an inline color regulation in medium-format machines, or straight printing. The term "inline inspection" means that a printing substrate 02 is inspected as it is being transported through the printing machine. The inline inspection system ensures that a level of quality, which is defined by the operator, is maintained during the entire production process.

The inline inspection system for assessing the quality of the printed product, which is produced using the printing machine, consists essentially of three components: at least one imaging unit 48, a camera and illumination electronics unit, and a control cabinet with an image processing system.

The imaging unit 48 is incorporated into the printing machine. It has, for example, a color-line camera 48, a constant light illumination or alternatively a flashing light illumination, and particularly a triggered line illumination. Both the constant light illumination and the flashing light illumination each have a plurality of light sources which are arranged side by side, typically in a linear fashion. Each illumination device is cooled, such as, for example, with water, and is provided with an angular sensor, with that angular sensor having a resolution of, for example, 10,000 lines.

The camera and the illumination electronics unit comprises all the functional units which are required to supply power to the illumination unit and to the signal preparation of the camera. This unit is accommodated at a suitable location near the imaging unit 48. It ensures a homogeneous illumination of the sheet being transported through the printing machine. Using a photometric function, tests are taken during the running of the machine, typically cyclically, to determine whether the light sources are functioning properly, and are within their intended operating range.

The control cabinet, with the image processing system, encompasses particularly, for example, a power supply for the image processing system and an image processing computer, preferably including an interface with a control center computer for operation (TCP/IP) and with the option for connection of a monitor, such as, for example a color monitor, for monitoring the printed products, and for displaying errors during operation. In the case of verso printing, a monitor reversing switch is also provided.

To control the system for assessing the quality of the printed matter, which is produced by the printing machine, an operator interface can be temporarily implemented on a second PC. This can be done before the operating software, in the case of series production, is integrated into a control center which is allocated to the printing machine.

Figure 4:
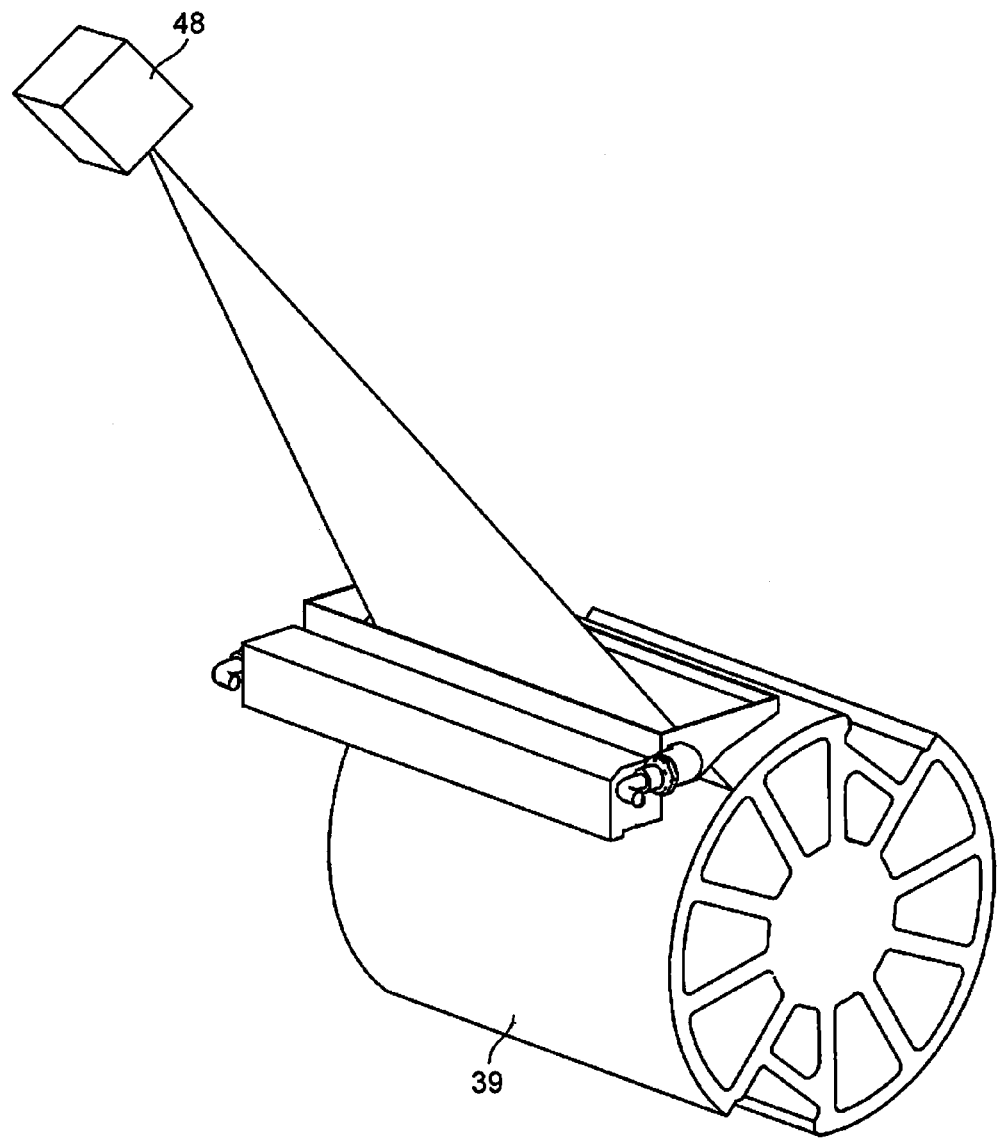
FIG. 4 a perspective representation of the inline inspection system depicted in FIG. 3 and situated in the printing machine.
Figure 5:
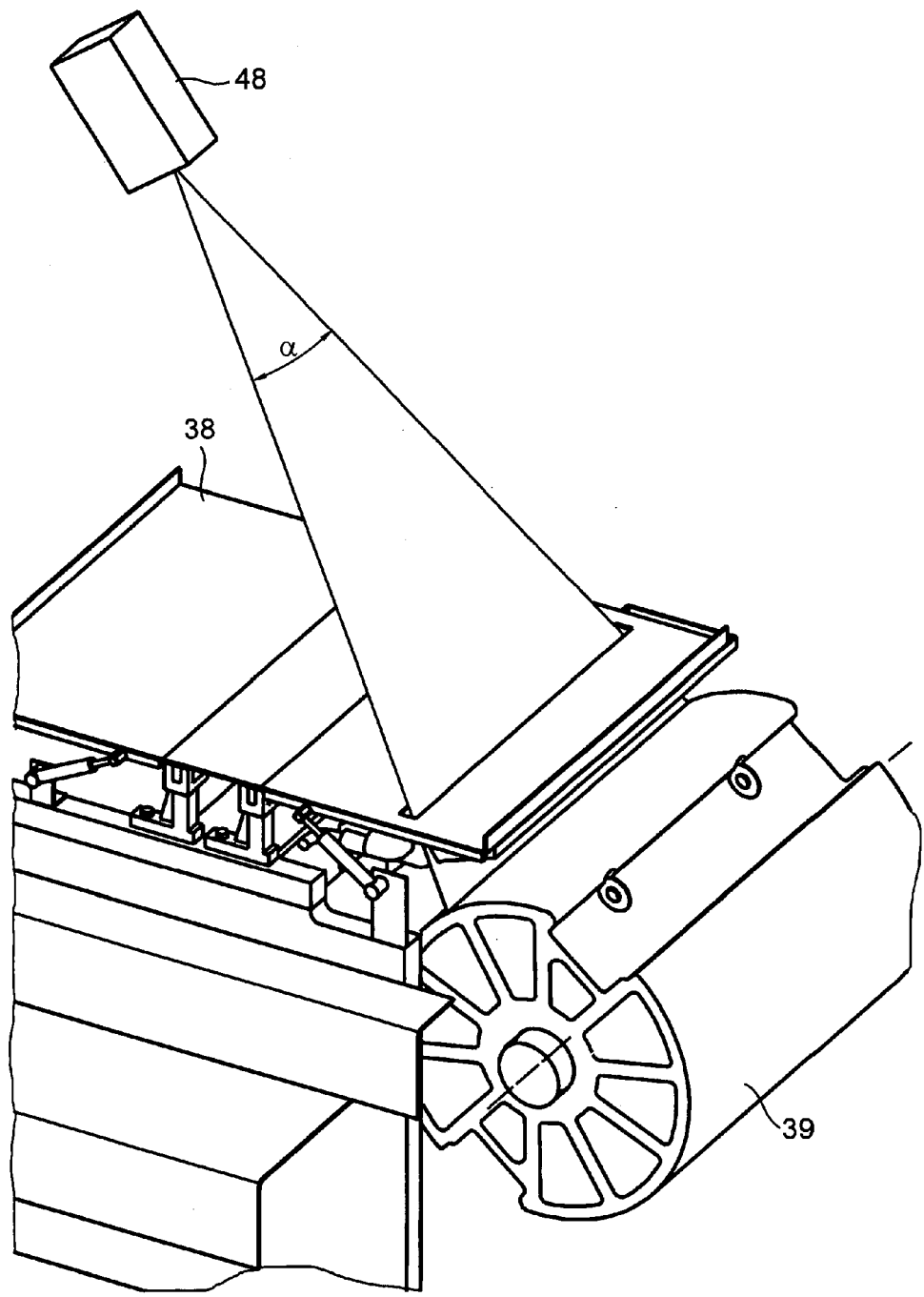
FIG. 5 another perspective representation of the inline inspection system depicted in FIG. 3 and situated in the printing machine.

Details of the arrangement of the inspection device 10; 11 and/or the inline inspection system within the sheet-fed printing machine are shown in FIG. 3 through 5. An illumination device 46, which is preferably arranged near a printing group cylinder 39, such as, for example, near an impression cylinder 39, preferably generates an illuminated strip 41, as may be shown in FIG. 6, on a sheet 02 being transported by the printing group cylinder 39. The illumination device 46 is preferably arranged inside a protective system 38 that encompasses a part of the printing group 01 of the printing machine, such as, for example, below a pedal mechanism 38 in the walkway area of the printing machine. Light which has been reflected from the illuminated strip 41, is detected within a certain coverage angle $\alpha$ by the use of a camera 48, which is arranged spaced somewhat from the printing group cylinder 39 as may be seen in 10. The camera 48 preferably detects light reflected from the illuminated strip 41 through a preferably narrow gap or slit in the protective system 38 or pedal mechanism 38 that covers the printing group cylinders 39. This gap or slit extends crosswise in relation to the direction of transport of the printing substrate 02.

A so-called error monitor is connected to a graphics card of an image processing system. That error monitor displays a live image from the camera 48. The printing error display is overlaid in the camera image. The operator is thus able to immediately identify the location of the error and, if applicable, the cause of the error. The error monitor displays both short-term print errors on the printing substrate 02, such as ink spatters, water droplets, or paper flaws, and long-term printing errors, such as an over- or undercoloration of individual printing inks or a toner.

A process learning mode is integrated into the inline inspection system for use in assessing the quality of the printed matter which is produced by the printing machine, which process learning mode is capable of automatically learning the current standard of quality during production of the product. The programming in of a model is therefore unnecessary. With the process learning mode, reference values especially for the inking model and for the intensity model are generated, which reference values are used as a basis of comparison for inspection and for color determination. The learning mode comprises particularly the following functions. Learning reference values, expanding learned or stored reference values, inputting the number of desired learning sheets, defining the window of the inspection area, displaying the learned or stored reference image, inputting the mask for an uninspected image area, processing the reference image, editing and copying masks.

Learning sheets, which have been transported through the printing machine, are diverted. This is done in order to enable the inspection of a potentially identified printing error, a measurement using a manual spectrometer, or a visual inspection. The reference models and all other relevant data are stored in a job memory. It is possible to read the job memory at any time for repeat orders.

During a production run, the inline inspection system is capable of learning permissible changes to the production run that are evaluated by the inline inspection system as errors. The inline inspection system thus adjusts adaptively to the current quality standard, and controls or regulates, for example, the inking unit and/or a lateral and/or circumferential register of the printing machine.

The human eye is capable of detecting relatively small color changes. However, a humans' color perception is configured for area detection. Small, punctiform color changes will not be detected. The color analysis model takes this physiological effect into account. The colors red, green and blue, that span the color space of the camera 48, are transformed into a color space that is identified as an inverse color model. The inverse color model corresponds to an electronic adjustment of human color perception. In this inverse color model there exist two inverse color channels, which react in a highly sensitive manner to color changes. Any tilting in the gray balance will be particularly reliably detected by these channels.

The inverse color model can also be implemented on the basis of the offset printing colors CMYK, with this color model being oriented toward subtractive color mixing (printing process) in relation to the perceptive color model.

Intensity variations, such as, for example changes in color density, are detected through gray-scale analysis. This process is advantageous especially in areas of achromatic colors, in cases of over- or undercoloration, and in cases of small defects, such as, for example small ink spatters or paper flaws.

The inking unit, which is used to meter the quantity of printing ink which is to be transferred to the printing substrate 02, can have a plurality of, for example, at least between 25 and 60, of zones in the axial direction of a forme cylinder of a printing group of the printing machine. The metering of the printing ink to be transferred to the printing substrate 02 can be adjusted differently in these different zones. The metering device of the inking unit can, for example, have controllable ink zone keys. The result is that, in a printing machine that prints using a multicolor printing process, a total of several hundred separately controllable ink zone keys can be provided. The metering device meters a quantity of printing ink to be transferred to the printing substrate 02 by adjusting at least one of its deposit thickness and/or its duration of application. Thus, the metering device can also be configured as an ink delivery system that uses at least one ink pump, such as, for example, as an ink injector system. Printing ink is delivered to an ink fountain roller of an inking unit, and can be metered on the ink fountain roller, preferably in zones, via correcting devices that act individually on the various ink zones. The correcting devices can have, for example, an ink metering element that can be actuated via at least one electrically actuatable servo drive, such as, for example, at least one fountain blade or one ink lever. The servo drive is configured, for example, as a servo motor that can be controlled via a control unit. The inking unit can be configured as a roller inking unit which is comprised of a plurality of rollers, or as an anilox inking unit. Alternatively, the inking unit can also be configured as a spray inking unit that atomizes a printing ink, and which preferably applies printing ink in zones on an ink fountain roller.

Color regulation can be accomplished using two different processes, depending upon the requirements specific to each particular case. When color-measuring strips, having color fields of sufficient size, are available, according to the plan for color density regulation, first the target densities for the individual colors are input with a color-measuring strip. The operator marks the position of the measurement control strip on the monitor. The fields of the strip are then automatically analyzed with respect to scale colors, and the respective actual density is determined. Special colors are marked in measuring strips by the operator. Using the variations from a target density and the present actual density, the color zones are adjusted on an inking unit of the printing machine. The respective variations are graphically and numerically displayed. Suggested values for the ink zone adjustment are provided by the inline inspection system. These suggested values can optionally be manually accepted or can be used, fully automatically, in the closed-loop system. With the help of the color-measuring strips, a tonal value increase can also be identified using the raster fields.

The algorithms for determining density in color-measuring strips can be run for each sheet 02. A flexible averaging of the measured values, over a random number of sheets, is also possible. Imprecise measurements that occur due to the effects of variations in pressure, due to a noise of the camera 48, such as, for example, due to a photon noise or due to a quantization noise of the AD converter, or due to an instability in the quantity of light which is being radiated from the illumination device, are reliably eliminated in this manner, or at least are minimized, in terms of their disruptive influence.

A calibration of the density measuring system is performed, using testing sheets that are fed through the machine at regular intervals. In this calibration, color balance, contrast and brightness level are automatically adjusted. Further, the standard illuminant for measurement can be established, for example the customary D50 or D65. In most cases, re-calibration is necessary no more than once a week.

The measuring strip has a field width and a field height, each measuring, for example, approximately 5 mm to 6 mm. The size of the measurement field, which requires a 2 degree standard observer, must be securely accommodated in the measuring field. The measuring strip consists of a plurality of equal segments, with a regular structure within each segment.

Another method of color regulation provides for a color determination and for color regulation using the printed image. The prerequisite for this color regulation is preferably that the surface coverage per ink color, having a resolution of 10<dpi<40, is known from a pre-press, for example CIP3, and that "significant" printing areas per color zone or per color zone area are present. Printing areas are considered significant if one of the ink colors in the area is dominant. The identification of the significant printing areas is accomplished automatically through an evaluation of data from the pre-press.

Color determination, and the derivation of manipulated variables for color regulation, are accomplished using the printed image itself. To this end, the camera image data are transformed into the CMYK space.

The printed image is analyzed, using a color integration of the significant print areas, within longitudinal strips. The number of these longitudinal strips preferably corresponds to the number of ink zone keys. These strips are then horizontally subdivided. Within the areas which are formed in this manner, and using the color changes and the zone density, the corresponding zone is adjusted. Through a corresponding averaging over a plurality of sheets 02, permissible process variations are compensated for.

A system deviation for coloration, which is calculated from the measurement, is converted for each color zone into a control command. Such a control command is usable for controlling the relevant ink zone key.

A certain amount of time is required before a change in the delivery of ink, which is effected within the printing machine, becomes apparent in the printed image. This time delay is based upon the nature of the ink transfer in the printing machine. To accelerate this process, an integral controller with a proportional component, which is referred to as a PI controller, is provided as the controller. This controller has the advantage that, in addition to a stationary component, or I component, for a certain amount of time, an error-proportional component ensures an additional/reduced delivery of ink, thereby accelerating the control process.

The added or decreased delivery of ink, which is implemented by the proportional component, is permitted, in a simplified manner, for a certain amount of time, such as, for example, for a certain number of cylinder revolutions. Once this time has elapsed, all color zones are moved to the stationary status.

The control loop is further simplified, such that a cyclical process, involving the steps of measurement, adjustment and waiting, is achieved. At the end of the waiting period, or, for example, following a certain number of cylinder revolutions, a new cycle is begun with a new measurement. Thus, although this is a closed control loop, it has an open functional principle. This is because the decisive time constant is determined by the time between the adjustment of the zones and a reaction on the paper. Because this time is proportional, for example, to a few tens of sheets, an open functional principle is realized here. Furthermore, the regulation is performed as a position control. The opening of the individual zones is adjusted and is held for a certain amount of time in this position. In order to achieve the target density as rapidly as possible, in the case of an ink delivery, the zones may optionally be over-regulated for a certain amount of time.

During the production run, the operator can manually input correction values, such as, for example, target values, for the ink zone keys. These changes are treated in the signal flow as a control deviation.

In the control algorithm, all of the parameters affecting coloring are integrated. These include especially ink behavior, such as, for example, a coverage of the ink, the paper behavior, and the ink transfer behavior of the ink fountain. In this control algorithm, the ink and the paper are job-dependent parameters.

The structure of the inline inspection system will now be described in more detail. The preferably digitally functioning imaging unit 48, as seen in FIGS. 3-5, comprises, for example, an illumination unit which has been developed specifically for a printing machine, and a color CCD line camera. The lens of the camera, which is specially adapted for the high-resolution camera 48, has a removable filter, such as, for example, a UV filter, as lens protection, and this lens can be easily adjusted by an operator. During servicing, the camera 48 and the lens can be easily replaced. The imaging unit 48 is protected against mechanical and electromagnetic breakdowns. For purposes of illumination, high-frequency synchronized illumination sources, which have been developed specifically for this application, are used, for example. The arrangement of the lamps inside the illumination unit is specially adapted, for example, for use of the illumination unit in sheet-fed printing. The lamps can be easily exchanged.

The imaging module or frame grabber converts the incoming video image to a digital video flow. In the frame grabber, this video flow is subjected to a brightness adjustment, or shading correction, to a perception-oriented color adjustment, and to the color space transformation. This digital video flow is placed in the memory of the imaging module for later processing. The imaging and image evaluation are performed in real machine time.

The inline inspection system is equipped, for example, with a positioning unit, which is capable of performing image positioning. Blurring, which may be caused during the transport movement of the sheet 02, may make it necessary to position the received printed image in the inline inspection system for each imaging procedure. During the learning process, a reference position is automatically determined for each sheet in the inline inspection system.

Figure 6:
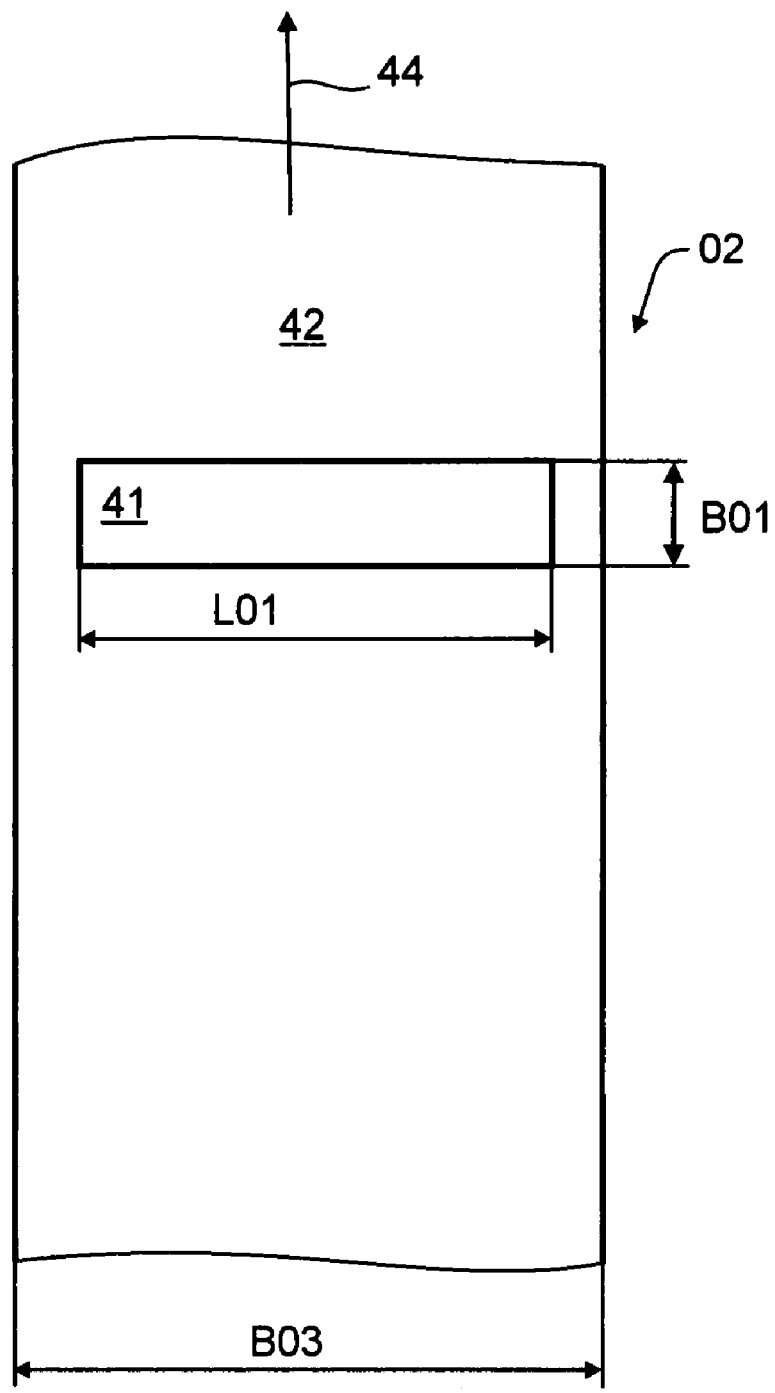
FIG. 6 a top plan view of a printing substrate movable in a printing machine in accordance with FIG. 1 or 2, and being provided with an illuminated strip.

In a learning mode, the inline inspection system images the sheets 02, as seen in FIG. 6, using the CCD camera during production, and forms a computer model using all of the variants of an acceptable print quality. Based upon a correct color adjustment, during the learning phase or mode of the inline inspection system, printed sheets or printed samples are scanned, analyzed and evaluated. The learning mode is capable of generating reference values in real machine time. After completing the learning mode, the inline inspection system automatically switches to the color-measuring and inspection mode. Using the learned reference values, the current production run is then inspected. However, it is possible, at any time, to expand a standard within the reference value memory by adding learned information.

A plurality of sheets 02 are scanned and evaluated. The RGB signal from the video camera is converted to the color separations CMYK. Each color separation is subdivided into strips, corresponding to the color zones. Within each zone, the area component of the relevant color separation is determined. This value is averaged over the scanned sheet 02. The averaged value for each area component from the learning phase is accepted as the desired value for the control phase.

In the inspection mode, each image is compared with the analysis models and reference values. The sensitivity of the inline inspection system can be adjusted to the particular conditions of the individual case by the operator using a small number of inspection parameters, such as gray-scale and color tolerances, and magnitude of error. The inspection mode comprises, for example, the following functions: continuous inspection of the running production job, input of tolerances for the inspection and definition of a grid for the horizontal and vertical subdivision of the inspection image. The input of inspection parameters that affect the inline inspection system can optionally be secured by a "password". The "password" can be changed, or a plurality of user-specific "passwords" can be assigned. During inspection, for example, up to 96 individual copies can be statistically scanned separately by the inspection system grid. Defective copies are identified by a grid frame, which is adapted to the optical conditions.

All stored variable input data are retained when the inline inspection system is shut off and is then turned back on. All input data and production sequences are stored in a log file. In the event of a loss of power, this log file will provide general data for the statistical system.

An error analysis processor analyzes the image comparison that is generated by the image processor. It generates an error image, which error image is overlaid into the live image from the error monitor. This allows the operator to intervene in the machine process immediately following analysis.

On a control center computer, a man/machine interface is implemented, all of the connections of which are preferably implemented via an optical coupler. The interface is, for example, an ethernet connection with TCP/IP.

The inline inspection system is preferably equipped with a hard drive memory, which has sufficient capacity to store different jobs, including all tolerance values and statistics. This job memory is configured, for example, for approximately 2,000 jobs. By expanding the hard drive, the number of jobs which can be stored can be increased accordingly.

During the learning process or mode, the computer model is used to determine whether a sheet 02 to be learned is defective to a significant degree. If this is the case, the sheet 02 is not learned. In other words, it is not incorporated into the current reference image used to define a standard of quality.

This adaptive process ensures that no unacceptable sheets 02 will be learned into a reference image.

The image comparison is performed in real machine time, for example at a rate of up to 18,000 sheets per hour.

An error in the quality of a printed product which has been generated using the printing machine, such as, for example, an over- or undercoloration, color variations and geometric effects, is detected in terms of perception-oriented error magnitudes. The color variations result in a degree of variation that is used to adjust the ink zone keys. A variation in color coverage of less than 10% is not regulated. The camera guarantees a 100% detection of the entire sheet.

To operate the inline inspection system, adjustments are made to the following:
  Target densities
  Position of the measurement control strip
  Assignment of colors to printing groups
  Gray-scale sensitivity
  Color channel sensitivity
  Magnitudes of error In the inline inspection, errors can be defined in terms of contrast and size. The size of the error may be a minimum of one pixel.

The machine interface transmits an alarm when one or more successive sheets 02, with printing errors, have been identified. In this process, differentiation is made as to whether the error involves a color variation that will lead to an ink zone key adjustment, or whether a geometric error is involved, or in other words, a short-term error.

Additionally, information is available, for example at SPS outputs, regarding whether a sheet is good or bad, and whether the inline inspection system is active or is in the learning mode.

To accomplish a precise analysis of a defective sheet 02, two modes of operation are available. In one mode of operation, the inline inspection system stops after an error, and in the other mode of operation the inline inspection system stops only temporarily. In the stop-after-error mode, the image of the sheet 02, including the error display, is frozen as soon as the inline inspection system detects an error on a sheet 02. The operator can view and evaluate the error display at leisure, and if necessary can verify it using the relevant printed sheet. The frozen image must be re-released by pressing a button. The inspection then continues. In the stop-and-continue mode, the image is automatically frozen following detection of an error, and after an adjustable interval of, for example, approximately 15 seconds. The frozen image is re-released. The operator is thereby afforded the opportunity, in the stop-and-continue mode, to view the image for a certain period of time without having to switch the inline inspection system back on manually.

During production, each sheet 02 is analyzed and a good, alarm, and defective sheet statistical analysis is performed. Furthermore, all relevant parameters of a production run are recorded and are transferred to the statistical module. Because statistical analyses are performed on a PC, it is possible to further process these analyses using commercially available programs.

At a minimum, the inline inspection system detects printing errors that occur during production when the printing error has a color measurement error with a color variation $\Delta E \geq 3$, and a density error precision of $\Delta D > 0.02$. Color errors which are caused by, for example, an over- or undercoloration, spatters or hickeys and register errors measuring approximately 0.025 mm$^2$ are considered inspection errors. In addition, paper errors, paper folding, paper flaws, contamination or oil can also be detected. Because 100% of the sheets are inspected, errors that could have originated in previous processes can also be detected. The inline inspection system can inspect any sheet size having an edge length of, for example, up to 740 mm×1,050 mm.

Various types of errors, such as surface defects, peak errors, overcoloration, undercoloration or color errors can be indicated on the error monitor using various symbols.

Tolerance values for the individual processing areas of a reference image can be numerically displayed and, if necessary, these tolerance values can be adjusted. The minimum number of pixels occurring as errors for a defective area that is outside of the tolerance range can be input.

The operating concept of the inline inspection system, in accordance with the present invention, will now be described. The inline inspection system is intended to be usable to permit simple and rapid operation, which will provide great benefit to printing companies, with low expenditure on training. A developing error must be pointed out to a printing machine operator before wasted paper is generated.

Operation is included as a task on the machine control center, which is integrated into the main operating concept of the machine. An additional monitor is provided for use in viewing a current error image. In the case of a verso printing machine, the image being viewed can be reversed. Functions that extend beyond the inspection operation, such as setting up a job or creating masks, can be achieved, for example, via corresponding entry points in the existing operating software for the machine, which is implemented in the machine control center.

Imaging is preferably accomplished when the printing substrate 02 to be inspected, such as, for example, the sheet 02 or web, is on a printing cylinder of the printing machine. In this case, the image record is highly stable. However, depending upon the material being printed, for example with the use of very thin paper as that material, folds can form or, for example, in the case of a rigid cardboard box, the sheet end can become detached on the circumferential surface of the printing cylinder. Imaging is to be calibrated mechanically during installation, so that known mechanical boundary conditions can be converted directly into the pixel dimensions of the image record.

A flow of data to, or from the machine control center allows a job name, a load number or the path to be received directly from the machine control center, and to be used for job management by the inline inspection system. From the sheet dimensions, the size of the main inspection window can be generated. The manually actuated good-sheet signal on the machine can be used to activate the inspection, and can be used for statistical evaluation. A "good-sheet counter", which may be generated by the inline inspection system, can optionally be fed to the machine control center statistical system.

In a flow of data to the printing machine, signals are generated to trigger a diversion or a sheet marking, in order to place the sheets 02 in either the defective sheet holding stack 08 or the good sheet holding stack 09, as depicted in FIG. 1.

The acceptance of the inline inspection system, by the printing press operator, is promoted by a consistent integration of that inspection system into the overall concept of the machine control system and a limitation to a minimally required, clear functional scope. Therefore, the look and feel of the control process is based strongly upon the appearance and the functionality of the machine control center software. The operational steps for setting up a job are kept small in scope. During the printing process, direct access to key functions is available via functional keys/hard keys through the control center operating software.

Setting up a new job is kept as simple as possible by the transfer of the largest possible amount of relevant data from the control center computer. Data to be transferred would include, for example, a job name, a job number, a load number, an inspection frame derived from the paper format, or a copy separation, for example from a CF2 file for a punching contour.

Manual inputs, that mean expenditure for the printing company, are limited to the input of the positioning window. The inspection window can also be automatically set, wherein it is then necessary to start the printing machine to set up the job. Learning can then be automatically started, with an active good-sheet signal.

Inspection and control center software share an operating monitor. During the printing process, the control center software is displayed. For minimal expenditure in operating the inline inspection system, hard keys or functional keys are provided in the control center software masks, for example for the functions switch front/back side, live/stop&Go/StopOnError or "Freeze".

The inspection control task, which is adapted, in terms of its look and feel, to the control center software, can also be activated via a functional key or a soft key. Full operability of the inline inspection system is then permitted. In this mode, with regard to the operation of the printing machine, only status information is shown, and this status information is displayed, for example, in an upper status window.

Adjustments to be implemented in the inspection control interface via the row of functional keys, similar to those adjustments implemented via the control center software, relate, for example, to tolerances, to learning/adding, to the creation of masks, to an adjustment of copy separation, to an adjustment of the inspection frame, to a re-definition of the positioning window, or to the loading or the viewing of images.

The live monitor is capable of displaying error indications in the CMYK color space or in special colors by using corresponding color displays.

Additional control elements in the control center software can provide for a correction of a net counter based upon the inspection result, a statistical analysis of defective sheets or a light indicating the inspection in the machine status field.

In the above-described printing machine, preferably in a rotary printing machine, and especially in a printing machine that prints using an offset printing process, a sheet 02, as represented in FIG. 6, and with a surface 42 is moved in a direction of motion 44, as indicated by an arrow. The sheet 02 is especially configured as a printing substrate 02 made, for example, of paper or cardboard, and especially intended for the manufacture of labels or folded cartons.

Figure 7:
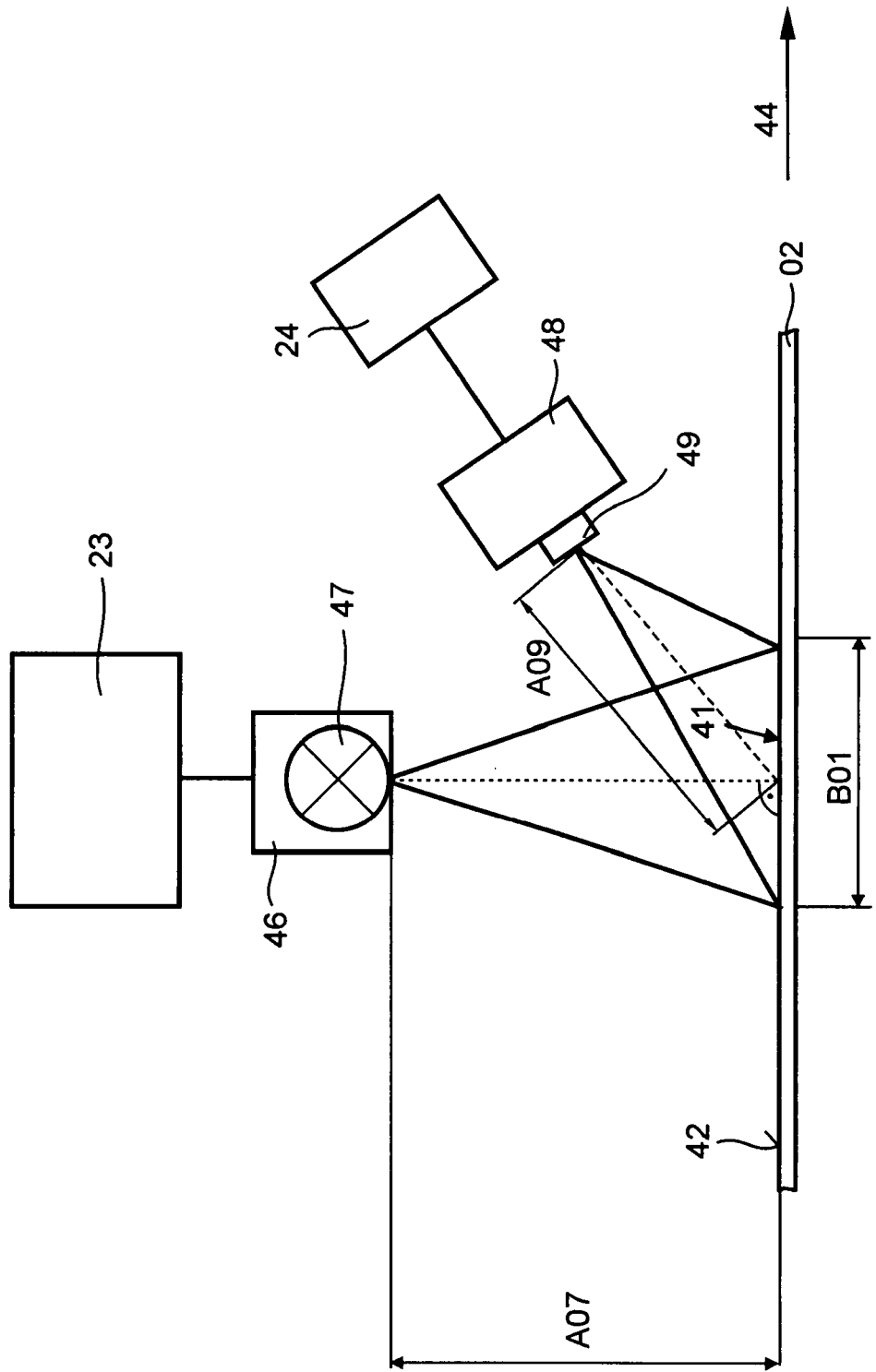
FIG. 7 a side elevation view of a further embodiment of an inline inspection system of a printing machine in accordance with FIG. 1 or 2

An illumination device 46, which is represented only symbolically in FIG. 7, generates an illuminated pattern 41 on the surface 42 of the sheet 02 in the form of an illuminated strip 41, as seen in FIG. 6 and having a length L01 and a width B01. The width B01 of the strip 41 extends orthogonally to the length L01 on the surface 42 of the sheet 02. The width B01 of the illuminated strip 41 is preferably oriented lengthwise relative to the direction of motion 44 of the sheet 02. The length L01 of the illuminated strip 41 is preferably oriented parallel to the width B03 of the sheet 02, and is thus crosswise to the direction of motion 44 of the sheet 02. The strip length L01 can extend over portions of the width B03 of the sheet 02 or over its entire width B03. The width B01 of the illuminated strip 41 preferably measures at least 3 mm, and especially measures 8 mm. The direction of motion 44 of the sheet 02 is therefore preferably oriented at least essentially parallel to the width B01 of the illuminated strip 41. The direction of motion 44 of the sheet 02 also lies within the plane that is spanned by the length L01 and the width B01 of the illuminated strip 41. The sheet 02 is preferably not curved, at least in the area of the location of the illuminated strip 41.

The illumination device 46 has a plurality of light sources 47, which may be arranged linearly side by side, so that the entire illumination device 46 is linear in configuration. The plurality of linearly arranged light sources 47 of the illumination device 46 are preferably oriented parallel to the length L01 of the illuminated strip 41. The light sources 47 are each spaced a distance A07 from the surface 42 of the sheet 02, as may be seen in FIG. 7, with the distance A07 preferably measuring between 30 mm and 200 mm, and particularly between 80 mm and 140 mm. The distance A07 of the light sources 47 is preferably oriented vertically with respect to the surface 42 of the sheet 02. All of the plurality of light sources 47 of the illumination device 46 are preferably similar in configuration, and may be, for example, bright, light-intense light-emitting diodes 47 or laser diodes 47. A central plane of the light which is emitted by the side-by-side light sources 47 of the illumination device 46, and a central plane of the light which is then reflected from the illuminated strip 41 to the camera 48 form a preferably acute angle γ with one another, which measures between 15 degrees and 60 degrees, especially between 20 degrees and 30 degrees, as may be seen in FIG. 3 and also in FIG. 7.

In the illumination device 46, groups, each containing a plurality of light sources 47, and arranged linearly side by side, can also be provided. The individual groups of light sources 47 can differ in their optical properties, such as, for example, in the wavelength of the light that they emit. Thus, for example, one group of light sources 47 can emit white light, whereas another group of light sources 47 can emit monochromatic light. A control device 23 can be connected to the illumination device 46 selectively and separately controls the groups of light sources 47 based upon specific application, such as, for example, based upon the quality of the surface 42 of the sheet 02, with respect to the color of the light. Thus, the control device 23 can also control a group of light sources 47 in terms of their brightness and/or their light duration, independently of at least one other group of light sources 47. The illuminated strip 41 is arranged outside of a focus of the light emitted by the light sources 47, which lies in the direct or diverted beam path.

Figure 10:
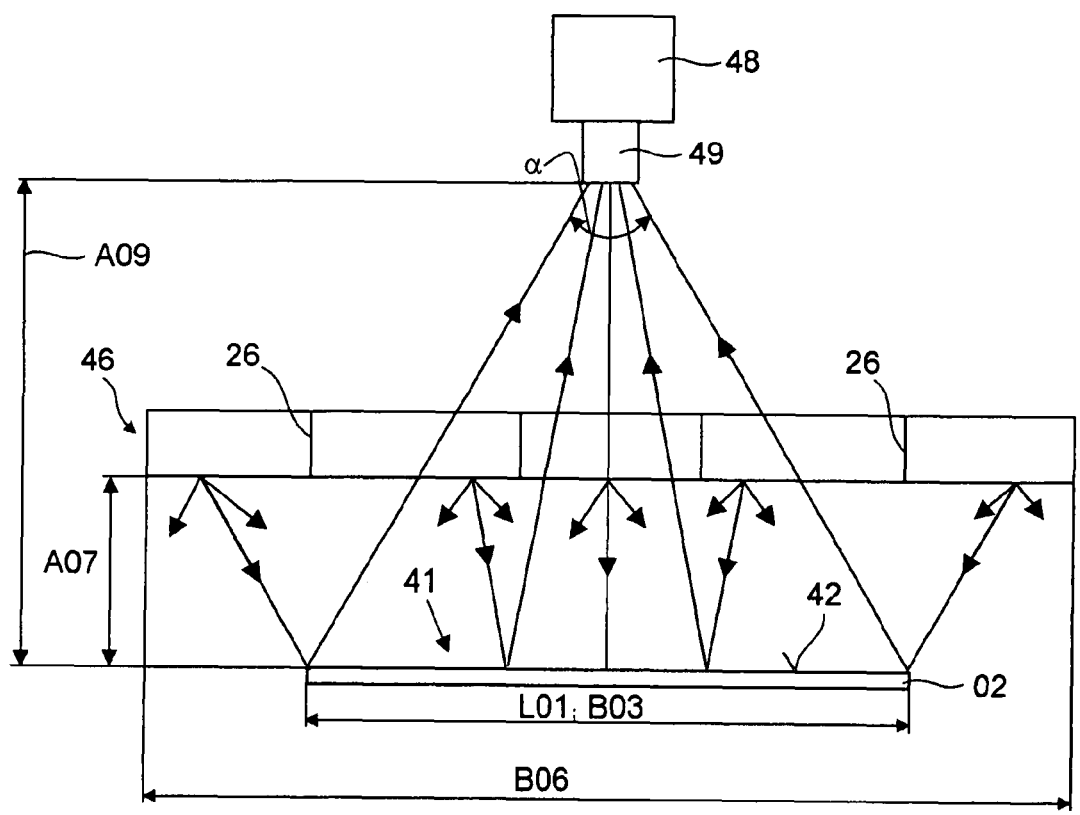
FIG. 10 a view of the inline optical inspection system in a direction perpendicular to a direction of travel of a sheet to be inspected.

The illumination device 46 is comprised, for example, of a plurality of modules which are arranged adjacent to one another in a linear fashion, each such module being provided with preferably a plurality of light sources 47 that are arranged side by side in a linear fashion. A separating joint 26, which is situated between two adjacent light modules, as seen in FIG. 10, is preferably arranged at an angle in relation to the length L01 of the illuminated strip 41. The individual modules of the illumination device 46 can be configured, for example, to each have the same function. Thus, for example, a line length of the illumination device 46, which illumination device 46 is comprised of a plurality of modules that are situated adjacent to one another in a row, and with that line length corresponding to the width B03 of the sheet 02 to be illuminated, can be activated by switching on the linearly arranged light sources 47 of the relevant module. Alternatively, a line length of the illumination device 46, which is comprised of a plurality of modules adjacent to one another in a row, and with that line length corresponding to the length L01 of the illuminated strip 41, can be activated by switching on the linearly arranged light sources 47 of the relevant module.

Figure 8:
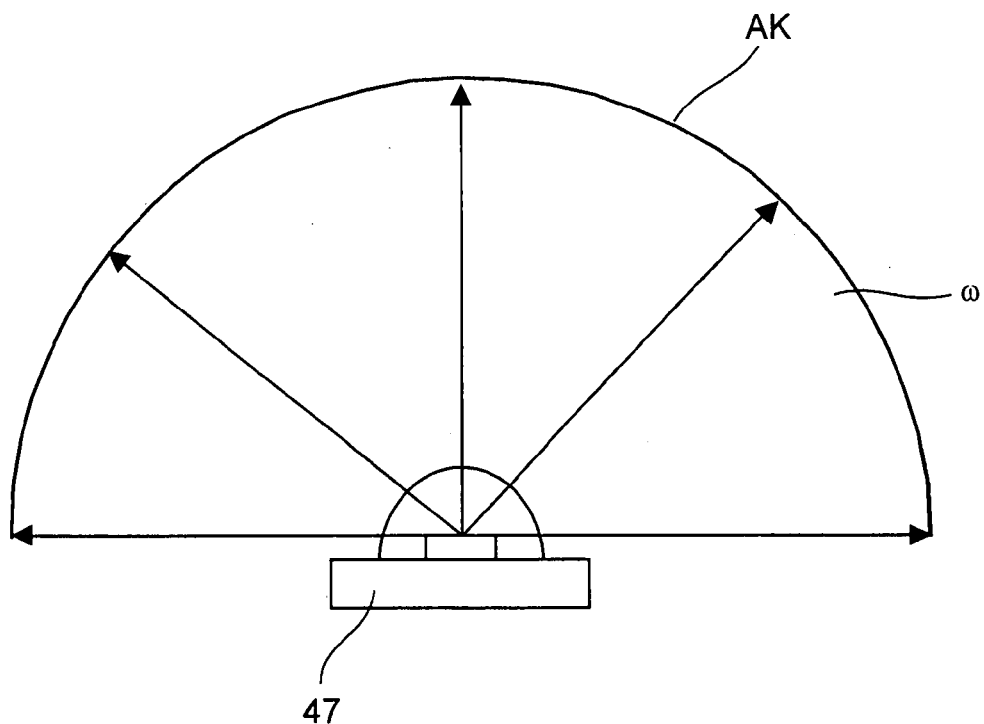
FIG. 8 a single light source of the illumination device of the inline inspection system of FIG. 7.

FIG. 8 shows a single light source 47 of the illumination device 46 in only a two-dimensional representation. The light source 47 emits its light within a solid angle ω, wherein the solid angle ω spans a surface AK which is segmented from a sphere or, in other words, a surface of a sphere AK, and up to the size of a hemisphere.

Figure 9:
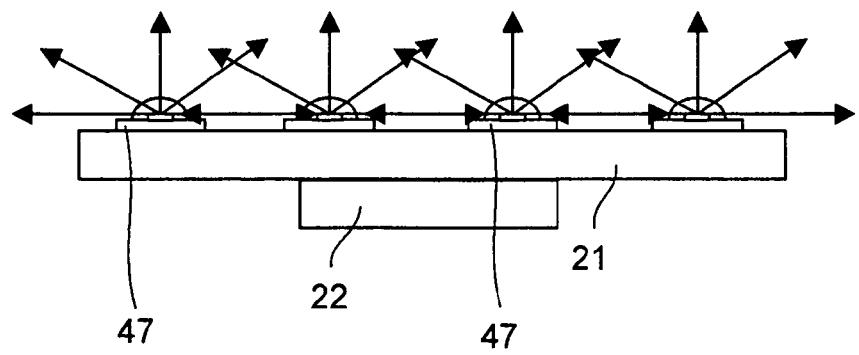
FIG. 9 a side view of the inline inspection system.

FIG. 9 shows a plurality, such as, for example, four, of the individual light sources 47, each of the type shown in FIG. 8, and arranged linearly side by side on a shared mounting plate 21. Preferably, the current source 22 for the respective light sources 47 is arranged on the same mounting plate 21. The current source 22 is preferably configured as a constant-current source 22, and is preferably configured as a controllable constant-current source 22.

As is shown in FIG. 7, the optical inline inspection system also comprises a data acquisition device 48 with at least one detector 49, which is arranged a distance A09 from the surface 42 of the sheet 02. The detector 49 detects light that has been reflected from the surface 42 of the sheet 02. The distance A09 ranges between 10 mm and 1,500 mm, and preferably ranges between 50 mm and 400 mm. The data acquisition device 48 is configured, for example, as a camera 48, is preferably configured as a line camera 48, and is especially configured as a color line camera 48. The data acquisition device 48 can also have a plurality of detectors 49 which may be arranged side by side in a linear fashion. These linearly arranged detectors 49 are preferably arranged parallel to the length L01 of the illuminated strip 41 which is depicted in FIG. 6. The detector 49 of the data acquisition device 48 can be configured, for example, as a CCD array 49 or as a group of photodiodes 49. The detector 49 of the data acquisition device 48 converts the detected reflected light from the sheet surface 42 into an electrical signal, and the data acquisition device 48 transmits that electrical signal for evaluation to an image processing device 24 that is connected to the data acquisition device 48.

FIG. 10 is a schematic view of the optical inspection system, taken in a plane that is perpendicular to the direction of motion 44 of the sheet 02. The illumination device 46 and the illuminated strip 41, which is illuminated on the surface 42 of the sheet 02 by the illumination device 46, are arranged parallel to one another, and are spaced apart by the distance A07. However an extension of the illumination device 46, or of its length B06, can be greater than the length L01 of the illuminated strip 41 or the width B03 of the sheet 02. The illumination device 46 is preferably subdivided into a plurality of modules. In this embodiment, it is divided into five such modules which are arranged linearly side by side, and wherein the light sources 47 which are arranged in each module emit light to the illuminated strip 41. The light that is reflected from the illuminated strip 41 is detected by the detector 49 of the data acquisition device 48, which is arranged at the distance A09 from the surface of the sheet 02. Such detected light lies within a spatial coverage angle α that opens lengthwise relative to the length L01 of the illuminated strip 41. In this depicted example, the coverage angle α is dimensioned such that the detector 49 detects the light which has been reflected from the illuminated strip 41, over the entire length L01 of the illuminated strip 41. The coverage angle α forms a cross-sectional area on the surface 42 of the sheet 02, so that the coverage angle α detects at least a portion of a cross-sectional area of the light beam which has been emitted by the illumination device 46, with that area extending over the width B01 of the illuminated strip 41. The cross-sectional area which is detected by the coverage angle α is preferably at least as large as the area spanned on the surface 42 of the sheet 02 by the length L01 and width B01 of the illuminated strip 41.

The quality of an image which is recorded by the data acquisition device 48, by detection of the light reflected from the illuminated strip 41, is primarily dependent upon the fact that the light sources 47 of the illumination device 46 emit light at a constant light intensity. Fluctuations in the intensity of the light emitted by the light sources 47 would produce the same result, in the data acquisition device 48, in terms of the signal that is fed to the image processing device 24, as do changes in the quality of the surface 42 of the illuminated sheet 02. The result is that in the image processing device 24, the causes of a signal change cannot be differentiated. Under such circumstances of fluctuations in the intensity of the light emitted by the light sources 47, no reliable statement as to the quality of the surface 42 of the illuminated sheet 02 can be obtained from an image evaluation performed in the image processing device 24.

Help is offered in this situation by the implementation of measures that keep the intensity of the light which is emitted by the light sources 47 of the illumination device 46 constant. The light sources 47, which are used in the illumination device 46, are preferably configured as light-intense light-emitting diodes 47 or as laser diodes 47, the light intensity of which is temperature-dependent. To achieve a constant light intensity, measures for stabilizing the temperature of the light sources 47 which are arranged on the mounting plate 21 are described. The advantage of this solution consists in the fact that the thermal load of the light sources 47 is removed directly at the location of origin, which allows short regulation times to be achieved.

The light sources 47 are preferably arranged on a mounting plate 21, as depicted in FIG. 9, and that mounting plate 21 can be loaded with additional electronic components and can be equipped with printed conductors. The semiconductor of the light-emitting diodes 47 or of the laser diodes 47 is preferably in direct contact with the mounting plate 21, which is configured, for example, as an MCPCB or metal core printed circuit board or as a mounting plate 21 with a core of aluminum. It has only a very thin coating on the thermally conductive base on its mounting side that supports the light-emitting diodes 47 or laser diodes 47, in order to provide the smallest possible thermal resistance.

The sheet 02 is typically being moved in a printing machine, or in a machine that is used to further process a printed product, and at a rate of several meters per second, such as, for example, at a rate of 3 m/s or more. In a sheet-fed printing machine, for example, 18,000 or even more sheets 02 can be printed and transported through the printing machine per hour. The optical inspection system, in accordance with the present invention thus can be configured such that a usable image of the moved sheet 02 is possible. If the data acquisition device 48 is configured as a line camera 48, the detected quantity of light which is reflected from the surface 42 of the moved sheet 02 changes based upon the speed of the moved sheet 02. This also alters the brightness of the image. At greater changes in speed, such as customarily occur in the aforementioned machines, the image can become unusable.

Rather than using an encoder to synchronize the imaging of the line camera 48 with the rate of the moved sheet 02, it is proposed, in accordance with the present invention, that an on-period t3 of an individual light source 47 or of a group of light sources 47 of the illumination device 46, which are controlled by a current source 22 that is, in turn, controlled by the control device 23, especially by a constant-current source 22, be synchronized with a triggering event, such as an illumination period t1 of the line camera 48. The result is that the surface 42 of the moved sheet 02 is always illuminated with the same quantity of light, regardless of the rate of speed of the moved sheet 02. This results in a constant brightness for the image which is recorded by the line camera 48, over a wide range of the rate of travel of the moved sheet 02.

Preferably, as was described previously, a plurality of groups of light sources 47 are provided in the illumination device 46, and to each of which groups 47, at least one current source 22, and especially a constant-current source 22, is allocated. The on-periods t3 for the groups light sources 47 are controlled by the control device 23 that is connected to the illumination device 46, such as, for example, by the respective current sources 22 in groups or even separately, independently of one another. The illumination device 46 allows a light quantity profile to be adjusted over the length of the preferably linearly arranged light sources 47 of the illumination device 46. The adjustment of a light quantity profile, preferably lengthwise in relation to the length L01 of the illuminated strip 41, has the advantage that transmission losses can be compensated for by an optic system of the line camera 48, which optic system is not specifically shown here.

A light sensor 37 that is connected to the control device 23, for example, can be utilized to measure the quantity of light which is radiated from the light sources 47 of the illumination device 46. This can be done in order to use the measuring signal from the light sensor 37 to adjust the on-period t3 of the light sources 47 which are controlled by the current sources 22 via the control device 23, for example to sense a degradation of the light sources 47, and by controlling the light sources 47 to compensate, for example, for a beam that, over time, decreases in terms of its quantity of light. The control device 23 can also automatically adjust the on-period t3 of the light sources 47 to different optical properties of the sheet 02 to be illuminated.

While preferred embodiments of a printing machine and of a method for producing a printed product, in accordance with the present invention, have been disclosed fully and completely hereinabove, it will be apparent to one of skill in the art that various changes in, for example, the drives for the cylinders, the power supplies for the printing units, the specific sheet conveyors and the like could be made without departing from the true spirit and scope of the present invention which is accordingly to be limited only by the appended claims.

What is claimed is:

1. A printing machine comprising:
   at least a first printing group adapted to print on a printing substrate using printing ink as the printing substrate is moved through the at least first printing group in a direction of transport of the printing substrate;
   at least one application device usable to apply at least a portion of at least one contactless identification feature, configured as an RFID system, onto the printing substrate, the at least a portion of the at least one contactless identification feature having at least one optical property in the shape of electrical printed conductors and which form an antenna of the RFID system;
   at least a first inspection device in the printing machine and configured to inspect the at least one optical property of the at least a portion of the contactless identification feature, the first inspection device being arranged, after, in the direction of transport of the printing substrate, the at least one application device and before, in the direction of transport of the printing substrates, the at least first printing group; and
   at least one second inspection device in the printing machine and configured to inspect the printed image of a printed product printed on the printing substrate.

2. The printing machine according to claim 1, characterized in that the at least one application device is a printing device for imprinting the at least a portion of at least one contactless identification feature.

3. The printing machine according to claim 2, characterized in that the printing device operates using a letterpress printing process.

4. The printing machine according to claim 2, characterized in that the printing device operates using an intaglio printing process.

5. The printing machine according to claim 2, characterized in that the printing device operates using a planographic printing process.

6. The printing machine according to claim 2, characterized in that the printing device is an offset printing group.

7. The printing machine according to claim 2, characterized in that the at least one printing group, viewed in the direction of transport of the printing substrate, is arranged downstream of the at least one printing device.

8. The printing machine according to claim 2, characterized in that the first inspection device is arranged on the at least one printing device.

9. The printing machine according to claim 2, characterized in that the printing device is configured to print electrically conductive material.

10. The printing machine according to claim 9, characterized in that the material contains a polymer.

11. The printing machine according to claim 9, wherein at least three printing devices are arranged to print the electrically insulating material.

12. The printing machine according to claim 2, characterized in that the printing device is configured to print electrically insulating material.

13. The printing machine according to claim 12, wherein at least two printing devices are arranged to print the electrically insulating material.

14. The printing machine according to claim 2, characterized in that the printing device is configured to print electrically semiconductive material.

15. The printing machine according to claim 1, characterized in that the at least one application device is an adhesion device for attaching the at least a portion of at least one contactless identification feature by adhesion.

16. The printing machine according to claim 15, characterized in that the adhesion device is configured to attach at least one chip of an RFID system by adhesion.

17. The printing machine according to claim 1, characterized in that the at least one application device is configured for applying an electronic component to the printing substrate.

18. The printing machine according to claim 1, characterized in that the at least one printing group and the at least one application device are located in-line in the direction of transport of the printing substrate.

19. The printing machine according to claim 1, characterized in that the at least first inspection device and the at least one application device are connected in-line.

20. The printing machine according to claim 1, characterized in that the at least one second inspection device, the at least one printing group and the at least one first inspection device are connected in-line.

21. The printing machine according to claim 1, characterized in that the at least one second inspection device is arranged on one of the at least one printing group and connected downstream of the at least one printing group.

22. The printing machine according to claim 1, characterized in that the at least one printing group is an offset printing group.

23. The printing machine according to claim 22, characterized in that at least four offset printing groups are provided for multicolor printing on the printing substrate.

24. The printing machine according to claim 1, characterized in that the printing substrate is configured as one of a sheet and a web.

25. The printing machine according to claim 24, characterized in that the printed substrate, configured as a sheet, can be fed to a sorting device.

26. The printing machine according to claim 25, further including providing transport path of the sheets, two holding stacks, arranged in series in the direction of transport of the printing substrate, and to each of which two holding stacks each of the printed sheets can optionally be delivered, based upon the quality of the printed product printed on each such sheet.

27. The printing machine according to claim 1, characterized in that the at least one printing group is configured having an axial direction and wherein, in the axial direction of the printing group, a plurality of copies are printed side by side on the printing substrate.

28. The printing machine according to claim 1, characterized in that the at least one printing group is configured having a longitudinal direction and wherein, in a longitudinal direction, a plurality of copies are printed in series on the printing substrate.

29. The printing machine according to claim 28, wherein copies of folding cartons are formed by the printing machine.

30. The printing machine according to claim 28, wherein copies of labels are formed by the printing machine.

31. The printing machine according to claim 1, characterized in that the at least first inspection device is configured to also inspect at least one of an electrical and magnetic and electromagnetic property of the at least one of a portion of a contactless identification feature.

32. The printing machine according to claim 1, characterized in that the at least one second inspection device is configured for the optical inspection of the printed product printed on the printing substrate.

33. The printing machine according to claim 1, characterized in that one of a CCD device and a CMOS device is provided to inspect the at least one optical property.

34. The printing machine according to claim 33, characterized in that the CCD device is a CCD line camera.

35. The printing machine according to claim 34, wherein said printing substrate has a maximum width and further wherein the maximum width of the printing substrate can be scanned using the CCD line camera.

36. The printing machine according to claim 1, characterized in that the at least one second inspection device is configured to inspect one register and the color properties of the printed image.

37. The printing machine according to claim 1, characterized in that the at least one second inspection device is arranged downstream of one of the at least one printing group and after a last printing group in the printing machine.

38. A method for producing a printed product including:
providing a printing machine;
using a printing technique and initially applying at least a portion of a contactless identification feature, configured as an RFID system to a printing substrate moving through the printing machine in a direction of travel;
subsequently printing a printed image on the printing substrate by applying printing ink to the printing substrate using the printing machine;
providing a first inspection device;
initially inspecting at least one of a property and a characteristic of the at least a portion of the contactless identification feature, following its application to the printing substrate, and with respect to at least one of an optical, electrical, magnetic, and electromagnetic property of the at least portion of the contactless identification feature using the first inspection device;
providing a second inspection device; and
inspecting optical properties of the printed product applied to the printing substrate, after the application of the at least a portion of the contactless identification feature to the printing substrate, and after the inspecting of the one of a property and a characteristic of the at least a portion of the contactless identification feature.

39. The method according to claim 38, further including operating the first inspection device in a contactless fashion.

40. The method according to claim 38, further including operating the first inspection device in an inductive fashion.

41. The method according to claim 38, further including inspecting the at least one of an optical, electric, magnetic and electromagnetic property of the identification feature at a first location in relation to the direction of travel, and inspecting the optical properties of the printed product at a second location.

42. The method according to claim 38, further including over printing the at least a portion of a contactless identification feature in multiple colors.

43. The method according to claim 38, further including inspecting properties of the RFID system in-line, and including at least one of a frequency of the antenna oscillator circuit and an identification number and the key to a digital signature.

44. The method according to claim 38, further including applying the at least a portion of a contactless identification feature and the printed image to the same side of the printing substrate.

45. The method according to claim 38, further including first applying the at least a portion of the contactless identification feature and then applying the printed image to the printing substrate in the printing machine.

* * * * *